United States Patent [19]

Bicking

[11] Patent Number: 5,497,084
[45] Date of Patent: Mar. 5, 1996

[54] GEARTOOTH SENSOR WITH MEANS FOR SELECTING A THRESHOLD MAGNITUDE AS A FUNCTION OF THE AVERAGE AND MINIMUM VALUES OF A SIGNAL OF MAGNETIC FIELD STRENGTH

[75] Inventor: Robert E. Bicking, Freeport, Ill.

[73] Assignee: Honeywell Inc., Minneapolis, Minn.

[21] Appl. No.: 398,414

[22] Filed: Mar. 3, 1995

[51] Int. Cl.$^6$ .............................. G01B 7/30; G01P 3/488; H03K 5/153; H03K 5/08
[52] U.S. Cl. ................... 324/207.25; 324/166; 324/174; 324/207.12; 324/207.2; 327/60; 327/510
[58] Field of Search ...................... 324/166, 173, 324/174, 207.12, 207.2, 207.21, 207.25, 251; 123/414, 418, 612, 617; 364/565; 327/58, 60, 62, 72, 510, 511, 516, 517

[56] References Cited

U.S. PATENT DOCUMENTS

| | | | |
|---|---|---|---|
| 4,734,594 | 3/1988 | Nelson | 307/309 |
| 4,760,285 | 7/1988 | Nelson | 307/309 |
| 4,769,597 | 9/1988 | Sano | 324/207.25 |
| 4,914,387 | 4/1990 | Santos | 324/166 |
| 4,992,731 | 2/1991 | Lorenzen | 324/174 |
| 5,015,878 | 5/1991 | Lasagna et al. | 324/173 X |
| 5,055,768 | 10/1991 | Plagens | 323/368 |
| 5,107,213 | 4/1992 | Ponticelli et al. | 324/207.25 |
| 5,164,668 | 11/1992 | Alfors | 324/207.2 |
| 5,221,250 | 6/1993 | Cheng | 324/174 X |
| 5,291,133 | 3/1994 | Gokhale et al. | 324/207.25 |

OTHER PUBLICATIONS

Podemski, Mark; paper titled "The Emergence of a New Sensor for Ignition Timing" SAE Technical Paper Series 870471, Feb. 1987, pp. 75–79.
Gastel, Thomas J.; paper titled "Digital Hall Effect Position/Motion Sensing of Offroad Equipment Components", SAE Tech. Paper Series 881236, Sep. 1988 pp. 1–7.
Product brochure titled "Hall Effect Gear Tooth Sensors" GTI Series, pp. 1–7, Microswitch a Honeywell Division (no date).

Primary Examiner—Gerard R. Strecker
Attorney, Agent, or Firm—William D. Lanyi

[57] ABSTRACT

A geartooth sensor is provided with a circuit which determined a threshold magnitude as a function of the minimum value of a first output signal from a magnetically sensitive component and an average output signal from a magnetic sensitive component. Circuitry is provided to determine the average signal. The minimum signal is then subtracted from the average signal and the resulting signal is doubled before being scaled by a predetermined fraction and then compared to the original output signal from the magnetically sensitive component. This circuit therefore determines a threshold signal as a function of both the minimum signal value and the average signal value and, in addition, enables the resulting signal to be scaled to a predetermined percentage of this difference for the purpose of selecting a threshold value that is most particularly suitable for a given application.

18 Claims, 11 Drawing Sheets

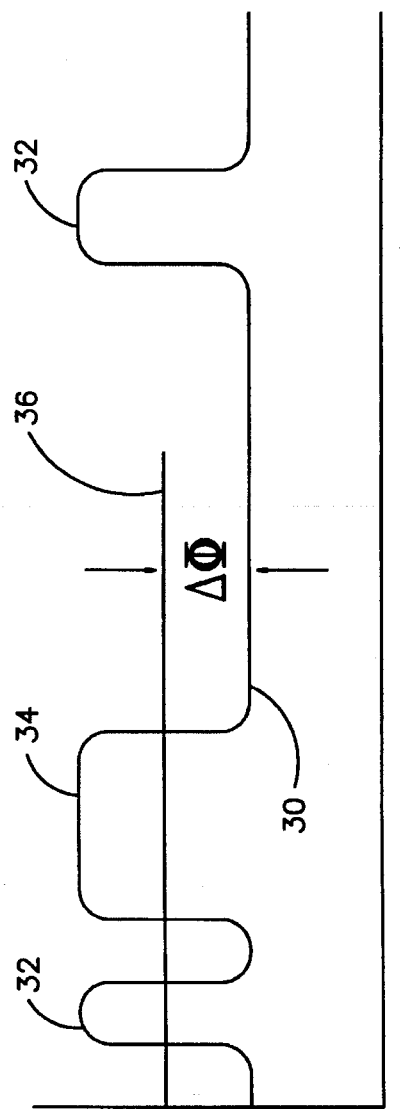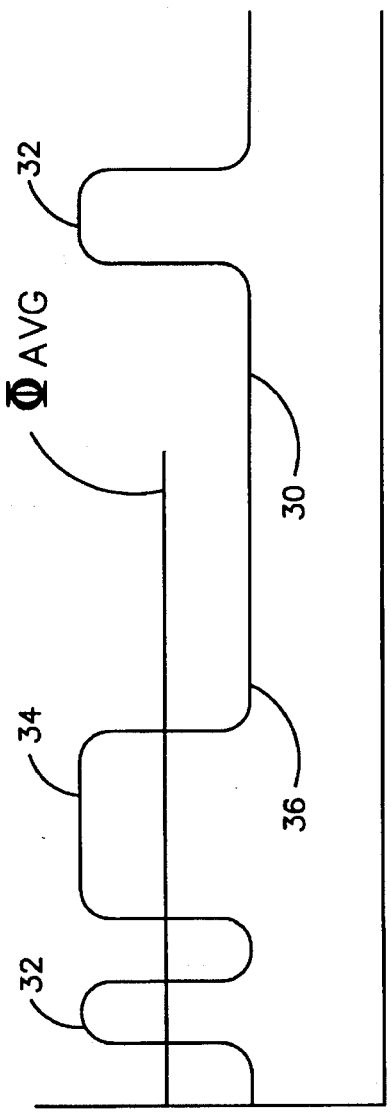

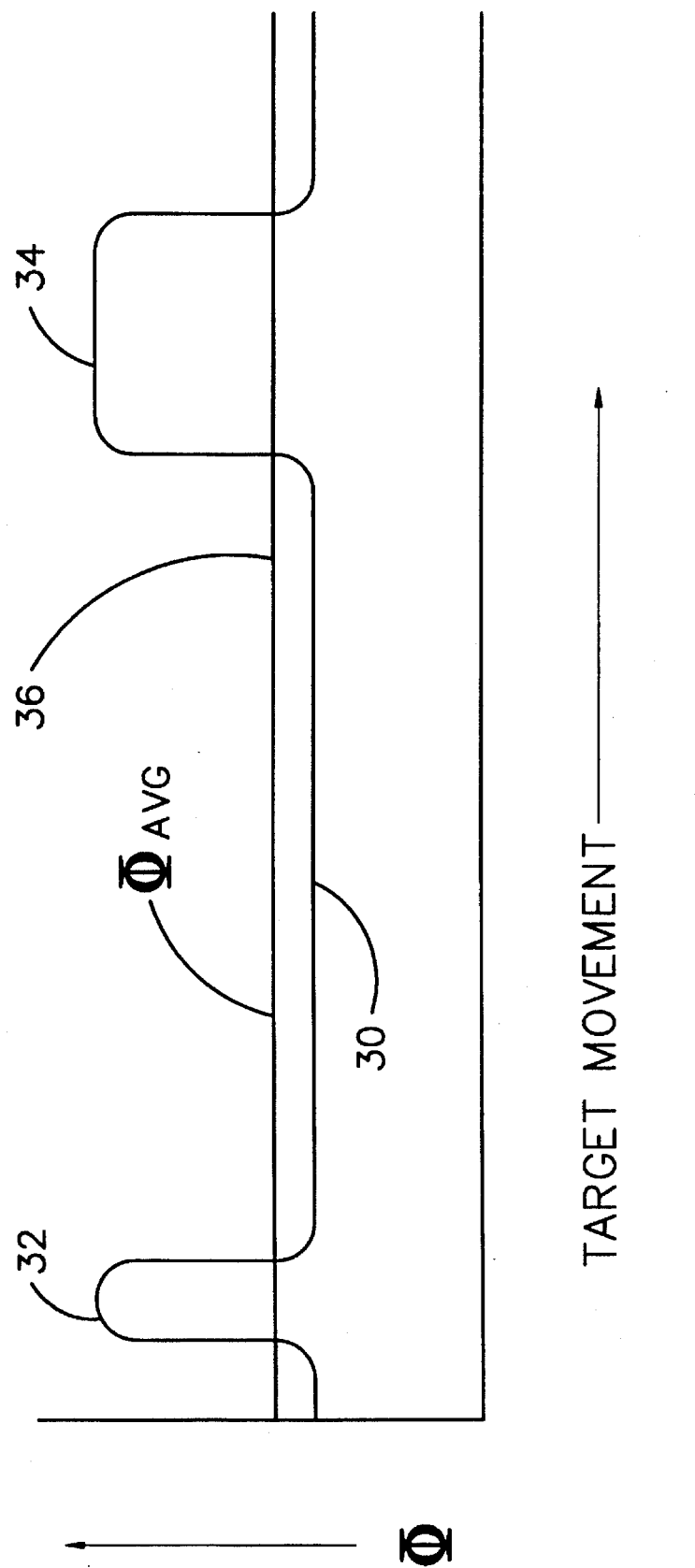

5,497,084

GEARTOOTH SENSOR WITH MEANS FOR SELECTING A THRESHOLD MAGNITUDE AS A FUNCTION OF THE AVERAGE AND MINIMUM VALUES OF A SIGNAL OF MAGNETIC FIELD STRENGTH

BACKGROUND OF THE INVENTION

1. Field of the Invention

The present invention is generally related to a geartooth sensor and, more particularly, to a geartooth sensor that measures the magnetic field strength imposed on a magnetically sensitive component and compares the magnetic field strength to a threshold that is calculated as a function of the minimum magnetic field strength and average magnetic field strength over a preselected period of time.

2. Description of the Prior Art

Many types of geartooth sensors are known to those skilled in the art. In order to detect the presence of a geartooth within a detection zone of the geartooth sensor, a threshold value is first determined and subsequent signals received from a magnetically sensitive component are compared to the threshold value to determine the presence or absence of a ferromagnetic geartooth within the detection zone.

In order to determine the appropriate threshold with which subsequent signals are compared, certain known geartooth sensor circuits determine a minimum value of the output signal from a magnetically sensitive component and then add a fixed offset magnitude to that minimum value. For example, if the minimum value is calculated to be 2,000 gauss, a fixed offset magnitude of 80 gauss can be added to the minimum value to create a threshold magnitude of 2,080 gauss. Subsequent signals from the magnetically sensitive component would then be compared to this threshold magnitude to determine the presence or absence of a geartooth within the detection zone. Other geartooth sensors determine the average value of the output signal from the magnetically sensitive component over a preselected period of time and use that average value as the threshold magnitude with which subsequent output signals from the magnetically sensitive component are compared.

U.S. Pat. No. 5,164,668, which issued to Alfors on Nov. 17, 1992, discloses an angular position sensor with decreased sensitivity to shaft position variability. The sensor is provided with first and second pole pieces that extend from regions proximate a rotatable magnet to regions proximate a magnetically sensitive device. The pole pieces provide magnetic paths of lowered reluctance that confine the lines of flux extending between the rotatable magnet and the magnetically sensitive device. The placement of the rotatable magnet between first and third pole piece segments of the invention significantly reduces the sensitivity of the sensor to variations in position of the rotatable magnet and therefore increases the reliability of the measurement system. This reduced sensitivity inhibits the degradation of operation accuracy that could otherwise be caused by inaccuracies in the magnet's shaft position, large tolerances in the dimensions of the shaft diameter and the bearing diameter and variable location of the shaft because of excessive bearing wear.

U.S. Pat. No. 4,992,731, which issued to Lorenzen on Feb. 12, 1991, describes a rotary speed sensor with baseline compensation of Hall cell output signal. The sensor system uses a permanent magnet and a Hall cell which is sensitive to the changing tangential component of magnetic field caused by the interrupted surface profile of a rotary element. In order to avoid anomalies caused by the variation of the base value of the tangential component of magnetic field, the output of a differential amplifier fed by the Hall cell is connected to a voltage averaging circuit which stores the average voltage of the output on a single capacitor. The output of the differential amplifier and the voltage across the capacitor are respectively coupled to the differential inputs of a Schmitt trigger exhibiting hysteresis. The Schmitt trigger thereby establishes operate and release points relative to the average voltage signal. The voltage averaging circuit is a nonlinear circuit in which the voltage across the capacitor is fed back to the negative input of an operational amplifier. A power up circuit is also provided for rapidly charging the capacitor initially to approximately the average voltage.

An SAE Technical Paper titled "The Emergence of a New Sensor for Ignition Timing" by Mark P. Podemski was presented at the International Congress and Exposition in Detroit, Mich. in February 1987. The paper describes sensors which are used for ignition timing and examines a new sensor that is based upon a technology which has been proven in the automotive market. Hall effect vane sensors have been used for many years. This paper describes the development of a Hall effect probe sensor that was developed to improve performance and reduce costs. Traditionally, Hall effect sensors have required either a magnet or fabricated vane targets to be mounted on a rotating shaft in order to receive appropriate position information about a rotatable member. The probe sensor described in this paper utilizes a specially designed integrated circuit to sense changes in magnetic flux densities created by the proximity of a metal target such as a geartooth. The sensor was designed particularly for the automotive market.

In a product brochure titled "Hall Effect Geartooth Sensors (GT1 Series)" geartooth sensors are described which use magnetically biased Hall effect integrated circuits to accurately sense the movement of ferrous metal targets. An integrated circuit, along with a capacitor and a bias magnet, are sealed in a probe type package which provides physical protection and mounting means. As a geartooth passes by the sensor face of a geartooth sensor, it concentrates the magnetic flux from a bias magnet. The sensor detects the change in flux level which translates into a change in the sensor output. The current sinking digital output will swing between the supply voltage and the saturation voltage of the output transistor.

An SAE Technical Paper titled "Digital Hall Effect Position/Motion Sensing of Offroad Equipment Components" by Thomas J. Gastel was presented at the International Off-Highway & Power Plant Congress and Exposition in Milwaukee, Wis. in September 1988. The paper discusses Hall effect magnetic solid state position and motion sensors. A new type of probe sensor was described. The sensor functions by sensing a change in magnetic field intensity and converts this change into an easy to use digital output voltage signal. The sensor discussed will be appropriate for use in extremely dirty and harsh environments found in off road applications. Possible uses of the sensor which are envisioned and described in this paper are traction systems, engine timing and fuel control systems, power shaft speed sensing, transmission control, wheel speed sensing, tachometer sensing and geartooth sensing. The paper includes an overview of the technology used and guidelines for incorporating the sensor in many different applications.

U.S. Pat. No. 5,055,768, which issued to Plagens on Oct. 8, 1991, describes a temperature compensator for Hall effect circuits. A resistor is formed in the same epitaxial layer of semiconductor material in which a Hall effect element is formed. The resistor is used to provide a temperature dependent voltage source which is inversely proportional to the resistance of a temperature sensitive load resistor on the Hall element output. A current mirror circuit is used to apply a current through the epitaxial layer resistor to the load resistor so that the voltage across the load resistor varies in a direct relationship with the sensitivity of the Hall element.

U.S. Pat. No. 4,734,594, which issued to Nelson on Mar. 29, 1988, discloses an offset correction for a sensor with temperature dependent sensitivity. A Hall effect device with offset compensation is provided with output terminals. The Hall effect element is formed in an epitaxial layer and the output terminals are connected to a differential current source. The sum of first and second currents produced by the source is determined by a resistor formed in the epitaxial layer in which the Hall effect element is formed and which is powered by the same electrical source as the Hall effect element so as to produce a current which tracks the current through the Hall effect element with temperature. The current through the resistor is split by a pair of trimmable temperature insensitive resistors and supplied to a pair of cross-coupled current mirrors which supply the currents to the output terminals of the Hall effect elements.

U.S. Pat. No. 4,760,285, which issued to Nelson on Jul. 26, 1988, discloses a Hall effect device with epitaxial layer resistive means for providing temperature independent sensitivity. The output signal of a Hall element is amplified by an amplifier circuit whose gain is determined by a resistor that is partially formed in the same epitaxial layer in which the Hall effect integrative circuit and Hall element are formed. A first amplifier stage is configured as a voltage to current converter and is connected through a current mirror to a second amplifier stage configured as a current to voltage converter. The current bias for the first amplifier stage is controlled by a resistor that is also partially formed in the epitaxial layer.

Geartooth sensors made in accordance with the prior art have certain disadvantages. For example, the use of a fixed offset magnitude which is added to the minimum signal value limits the flexibility of the sensor and makes it susceptible to variations in the gap between a magnetically sensitive component and the ferromagnetic teeth of a gear. On the other hand, geartooth sensors which calculate an average value of the output signal from a magnetic sensitive component are susceptible to variations in the gap between the magnetically sensitive component and the ferromagnetic teeth of a gear that can result from run out of the gear. For example, if the gap between the teeth and the magnetically sensitive component varies as a function of the angular position of the gear, possibly due to misalignment or non-circularity of the gear, the maximum output signal magnitude from the magnetically sensitive component can vary as a function of the angular position of the gear. This, in turn, changes the average value that is calculated as a function of both the minimum and maximum magnitudes of the output signal from the magnetically sensitive component. Other known geartooth sensor circuits also suffer the disadvantage of not being selectable as a function of the application of the sensor.

It would therefore be advantageous if the geartooth sensor could be provided with a circuit that enables the selection of a threshold magnitude which is not dependent on the maximum value of the signal from the magnetically sensitive component.

SUMMARY OF THE INVENTION

A geartooth sensor made in accordance with the present invention comprises a permanent magnet and a magnetically sensitive component disposed proximate the magnet. It also comprises a first means for providing a first output signal which is representative of the presence of a ferromagnetic member within a detection zone of the sensor. The magnetically sensitive component can be a Hall element or a magnetoresistive component. In a typical application of the present invention, the output signal from the magnetically sensitive component is amplified. In addition, a temperature compensation circuit is used to provide an output signal that is not sensitive to changes in ambient temperature. The present invention also comprises a second means for providing a second output signal which is representative of an average value of the first output signal over a first preselected period of time. An R-C network is used to select the preselected period of time. The present invention also comprises a third means for providing a third output signal which is representative of a minimum value of the first output signal over a second preselected period of time. The first and second preselected periods of time are generally equal to each other in a particularly preferred embodiment of the present invention.

The present invention also comprises a fourth means for providing a fourth output signal which is a function of the difference between the second and third output signals. The specific relationship between the second and third output signals can be advantageously selected, depending on the intended application of the geartooth sensor. For example, the fourth output signal can be set equal to twice the difference between the average signal and the minimum signal. The present invention comprises a fifth means for providing a fifth output signal which is representative of the difference between the first and fourth output signals. In a particularly preferred embodiment of the present invention, the fifth output signal is a comparison of the first output signal and a threshold magnitude that is equal to twice the difference between the average of the first output signal and the minimum value of the first output signal. A means is provided to select a percentage of the difference between the second and third output signals to be used as the threshold with which the first output signal is compared. This can be accomplished by providing a divider circuit which comprises two resistors. The second providing means can comprise a means for doubling the average value of the second output signal. The fourth output signal can be generally equal to two times the difference between the average value of the first output signal and the third output signal.

In a particularly preferred embodiment of the present invention, the geartooth sensor is used in conjunction with a gear which has a plurality of teeth. The gear is rotatable about an axis of rotation and the plurality of teeth are movable through a detection zone of the geartooth sensor.

BRIEF DESCRIPTION OF THE DRAWINGS

The present invention will be more fully and completely understood from a reading of the Description of the Preferred Embodiment in conjunction with the drawings, in which:

FIGS. 3 and 4 show signals from a geartooth sensor and thresholds determined by known methods;

FIG. 5 illustrates a problem commonly encountered in known geartooth sensors;

DESCRIPTION OF THE PREFERRED EMBODIMENT

Figure 1:
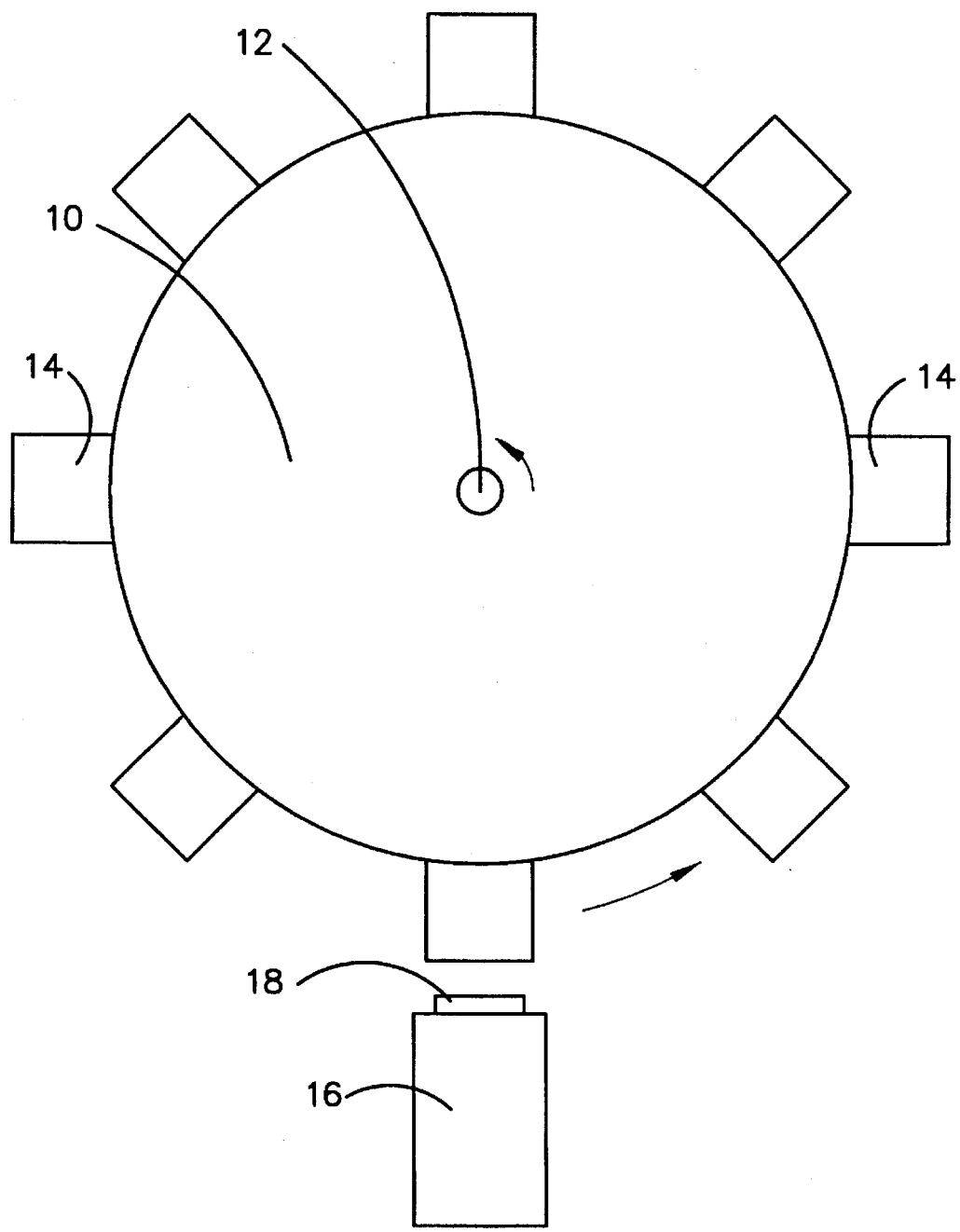
FIG. 1 illustrates a typical application of a geartooth sensor.

Throughout the Description of the Preferred Embodiment of the present invention, like components will be identified by like reference numerals.

FIG. 1 illustrates a typical example of a geartooth sensor. A gear 10 is arranged for rotation about a central axis 12. A plurality of gearteeth 14 is attached to the gear for rotation through a detection zone of the geartooth sensor. The simplified schematic representation of the geartooth sensor in FIG. 1 comprises a magnet 16 and a magnetically sensitive component 18. The magnetically sensitive component 18 can be a Hall effect element or an arrangement of magnetoresistors. The specific configuration of the magnetically sensitive component 18 is not limiting to the application of the circuit of the present invention.

Figure 2:
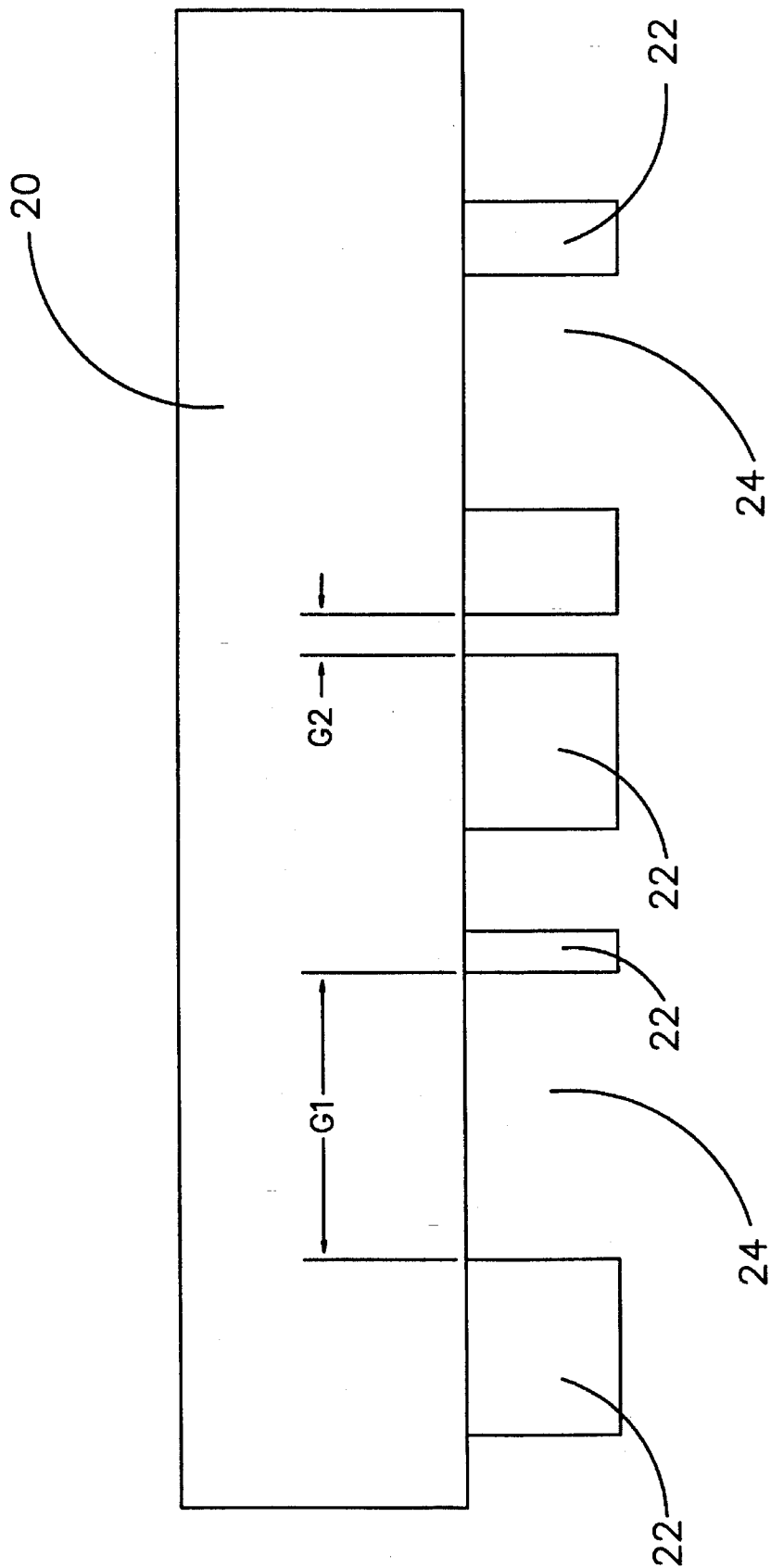
FIG. 2 illustrates the possible variability between the sizes and spacing of teeth and interstitial slots of a target.

FIG. 2 is a simplified schematic of a target 20 which comprises a plurality of ferromagnetic members 22 that are spaced apart and separated by interstitial spaces 24. As can be seen in FIG. 2, the interstitial spaces 24 and the ferromagnetic members 22 vary in shape and size. Some of the ferromagnetic members 22 are larger than others and some of the interstitial spaces 24 are larger than others. For example, the interstitial space identified as G1 is much larger than interstitial space identified as G2. Because of the possible variation in size and spacing of the teeth, certain limitations are imposed on the ability of a geartooth sensor to accurately determine the presence and position of a geartooth within its detection zone. These problems will be described in greater detail below.

FIG. 3 illustrates one known technique for determining a threshold magnitude with which the output of magnetic field strength is compared. FIG. 3 illustrates the changing magnitude of a first output signal 30 provided by a Hall effect element. The maximum values of the signal 30 represent gearteeth passing through the detection zone of the sensor. A narrow tooth will provide a narrow signal 32 while a broader tooth will provide a broader signal 34. One known method for providing a threshold magnitude 36 is to calculate a minimum value of the signal 30 and then to add a constant offset magnitude, such as the one indicated as $\Delta\Phi$, to provide the threshold magnitude 36. The threshold magnitude 36 is then used to compare with the signal 30. When signal 30 exceeds the threshold 36, a tooth is determined to be within the detection zone of the sensor. When the signal 30 is less than the threshold 36, an interstitial space is determined to be within the detection zone of the sensor. One disadvantage of the technique illustrated in FIG. 3 is that the fixed offset that is added to the minimum value of signal 30 does not take into account the possible variation in the maximum values of the signals representing the teeth, such as those identified by reference numerals 32 and 34. The magnitudes of the maximum values of signal 30 are sensitive to the gap or distance between the magnetically sensitive component and the tooth passing through the detection zone. In certain applications, it is difficult to hold this gap magnitude within a close tolerance. In addition, runout of the gear can cause variations in the gap which change as a function of the angular position of the gear.

FIG. 4 shows an alternative known technique for determining the threshold 36. A circuit is provided for averaging the minimum and maximum values of signal 30 and calculating an average value $\Phi_{AVG}$. The threshold 36 is then used, as described above, in comparison with the magnitude of signal 30 to determine the presence or absence of a tooth within the detection zone of the sensor. The technique represented in FIG. 4 can be disadvantageously affected by the relative sizes and positions of the gearteeth. In other words, the magnitude of threshold 36 in FIG. 4 is a function of the duty cycle of the teeth compared to the interstitial slots. If only a few narrow teeth are present, the average magnitude of signal 30 will be much closer to the minimum value of signal 30 then if a large plurality of teeth are present and the interstitial slots are narrow. This problem is illustrated in FIG. 5. Because of the relatively large space between teeth 32 and 34, the duty cycle of signal 30 is relatively low and the average magnitude 36 is much closer to the minimum value of signal 30 than to the maximum value.

Figure 6:
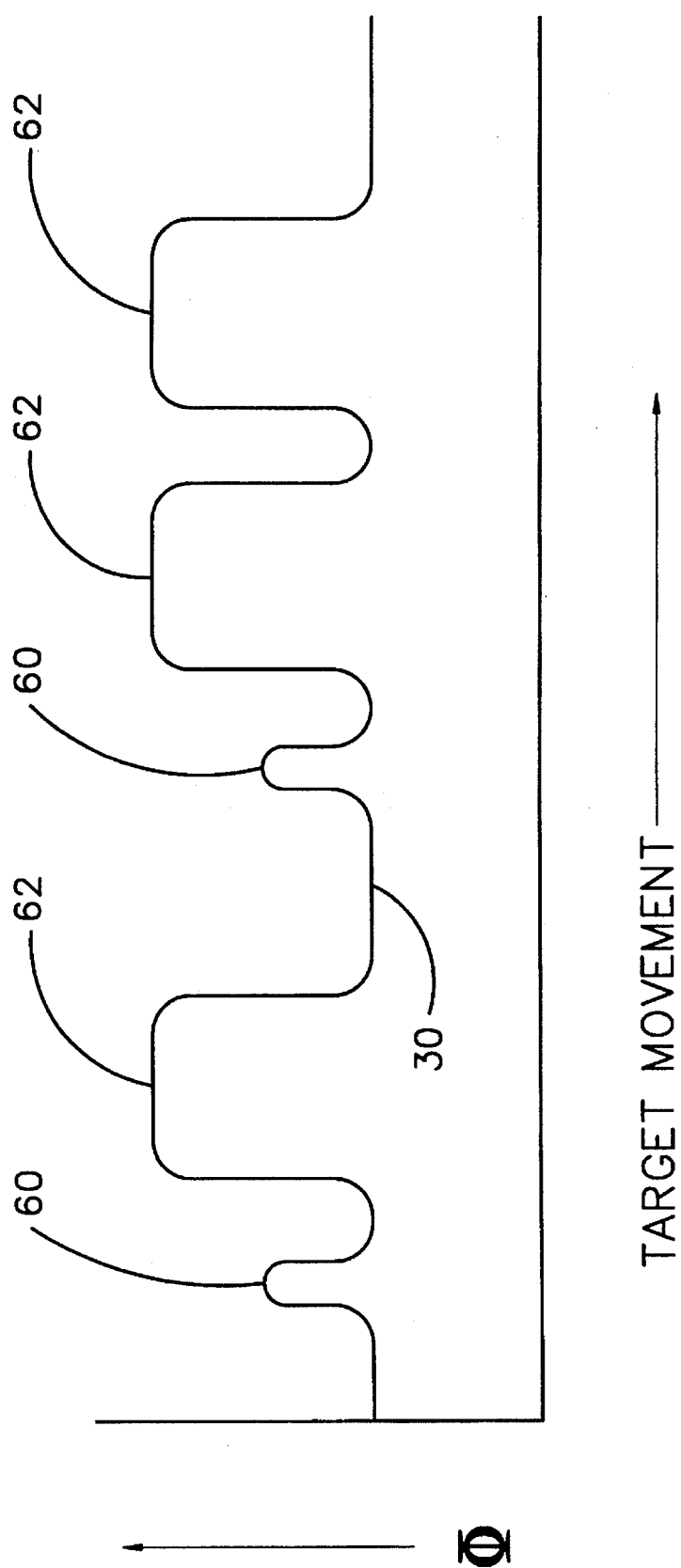
FIG. 6 illustrates a problem encountered by known geartooth sensors when extremely small teeth are to be sensed in conjunction with larger teeth.

FIG. 6 illustrates another problem that can be associated with geartooth sensors when the gear comprises excessively narrow teeth. In FIG. 6, the signal 30 provided as an output signal by a magnetically sensitive component can provide signals representing narrow teeth 60 which are not only shorter in time duration than larger teeth 62 but, in addition, have maximum values that are significantly less than the maximum values provided by the larger teeth 62 even though the gap between the magnetically sensitive component and the smaller teeth is generally identical to the gap between the magnetically sensitive component and the larger teeth. This is a phenomenon that can occur in many different types of geartooth sensors when certain teeth of a gear are significantly smaller in width than other teeth. Naturally, care must be taken to select a threshold magnitude that is sufficiently low to identify the smaller teeth 60. Otherwise, the signal 30 will not rise to a sufficient magnitude to be detectable by comparison of signal 30 to the threshold magnitude.

Figure 7:
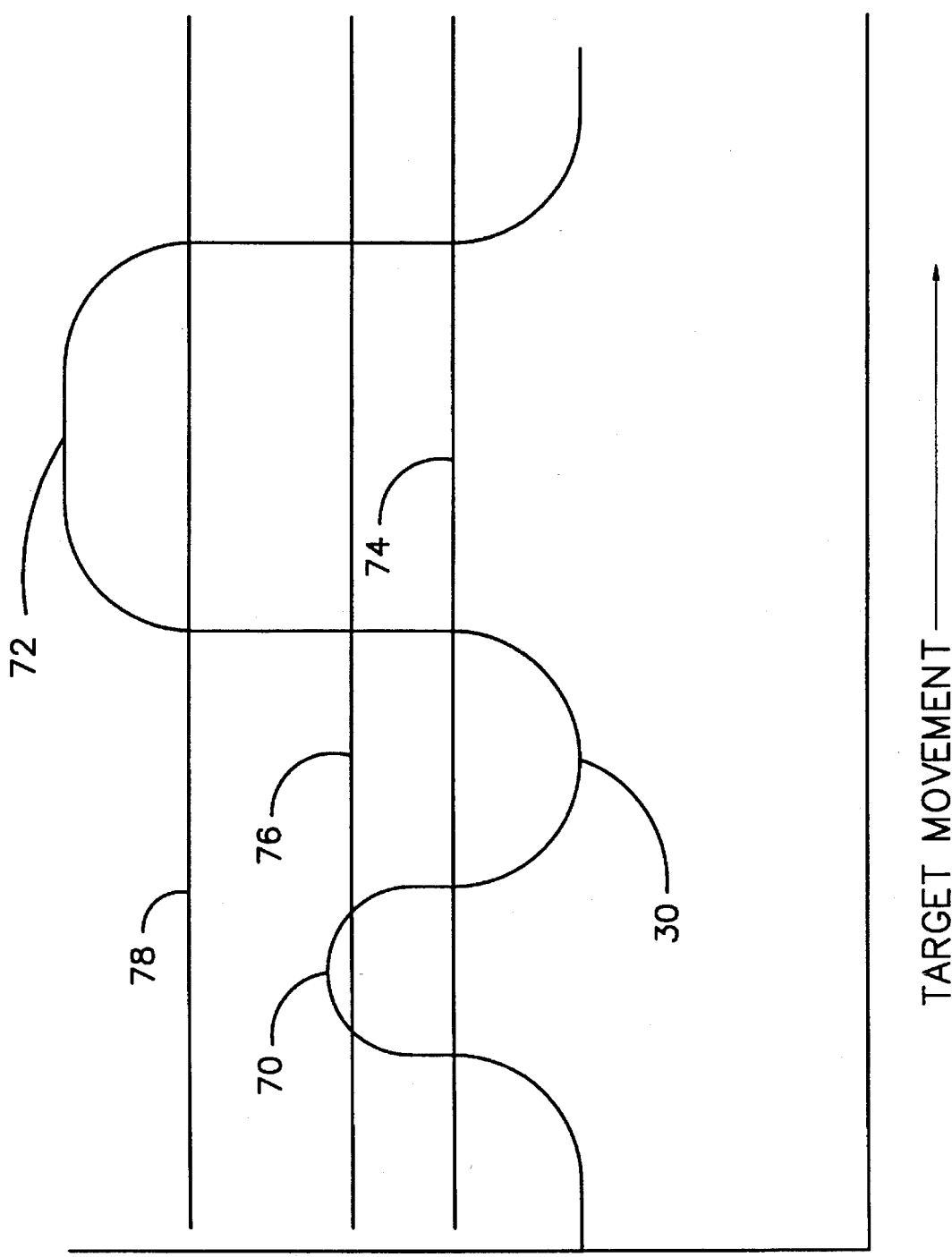
FIG. 7 shows the problems with known geartooth sensors if threshold magnitudes are not appropriately selected.

FIG. 7 is an exaggerated representation of a signal 30 which illustrates this problem. In FIG. 7, signal 30 is shown having a first portion 70 which represents the change in signal 30 when a small tooth passes through the detection zone and a signal portion 72 which represents the change in signal 30 when a larger tooth passes through the detection zone. The lines identified by reference numeral 74, 76 and 78 represent three alternative threshold levels that could possibly be used in conjunction with signal 30 to determine the presence or absence of teeth passing through the detection zone of the sensor. Line 74 could be used for comparison with signal 30 to determine the presence of gearteeth within the detection zone. Both the small tooth 70 and the large tooth 72 would be identified appropriately by using threshold 74. If threshold 76 is used, both of the teeth could be identified through comparison of line 76 with signal 30, but the apparent width of the smaller tooth 70 is significantly smaller than its actual size. If, for example, an engine manufacturer wishes to be able to identify the relative widths of the teeth, the use of line 76 would not suffice. The relative apparent widths of the small and large teeth in FIG. 7 is greatly exaggerated because of the position of the threshold line 76. With continued reference to FIG. 7, it can be seen that the use of threshold line 78 is totally inappropriate because it would not be able to detect the presence of the small tooth 70.

Figure 8:
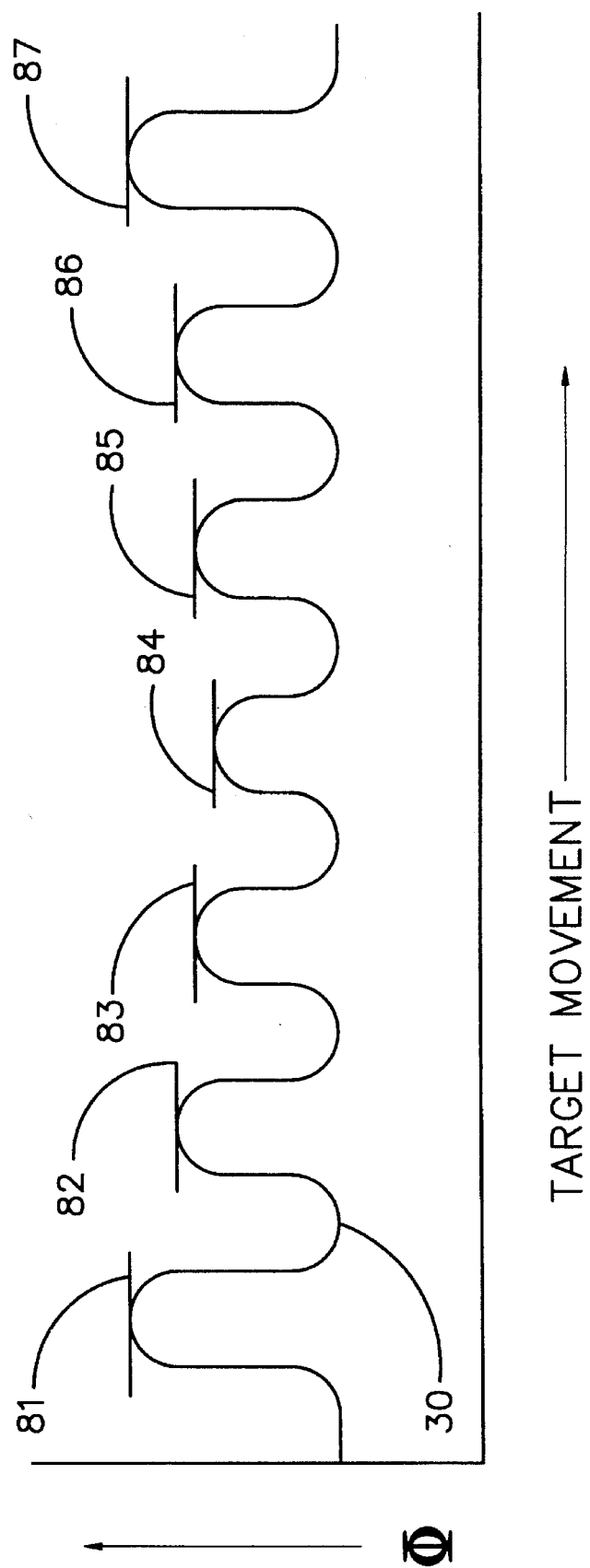
FIG. 8 shows the signal of a geartooth sensor that results from a variable gap between the magnetically sensitive component and a plurality of teeth of a gear.

FIG. 8 illustrates a problem that is inherent in many different types of geartooth sensors. Although the minimum magnitudes of signal 30 are relatively constant, the maximum magnitudes, represented by reference numerals 81–87, vary significantly. The pattern illustrated in FIG. 8 is typical of a situation where the gear is either mounted slightly off center or is partially ovate in shape. This is referred to as runout and produces maximum values of signal 30 which change as a function of the angular position of the gear. Naturally, if the maximum values of signal 30 are used to determine a threshold, the threshold will continually vary as a function of the rotation of the gear and will therefore be unsuitable in applications where accuracy is required.

Figure 9:
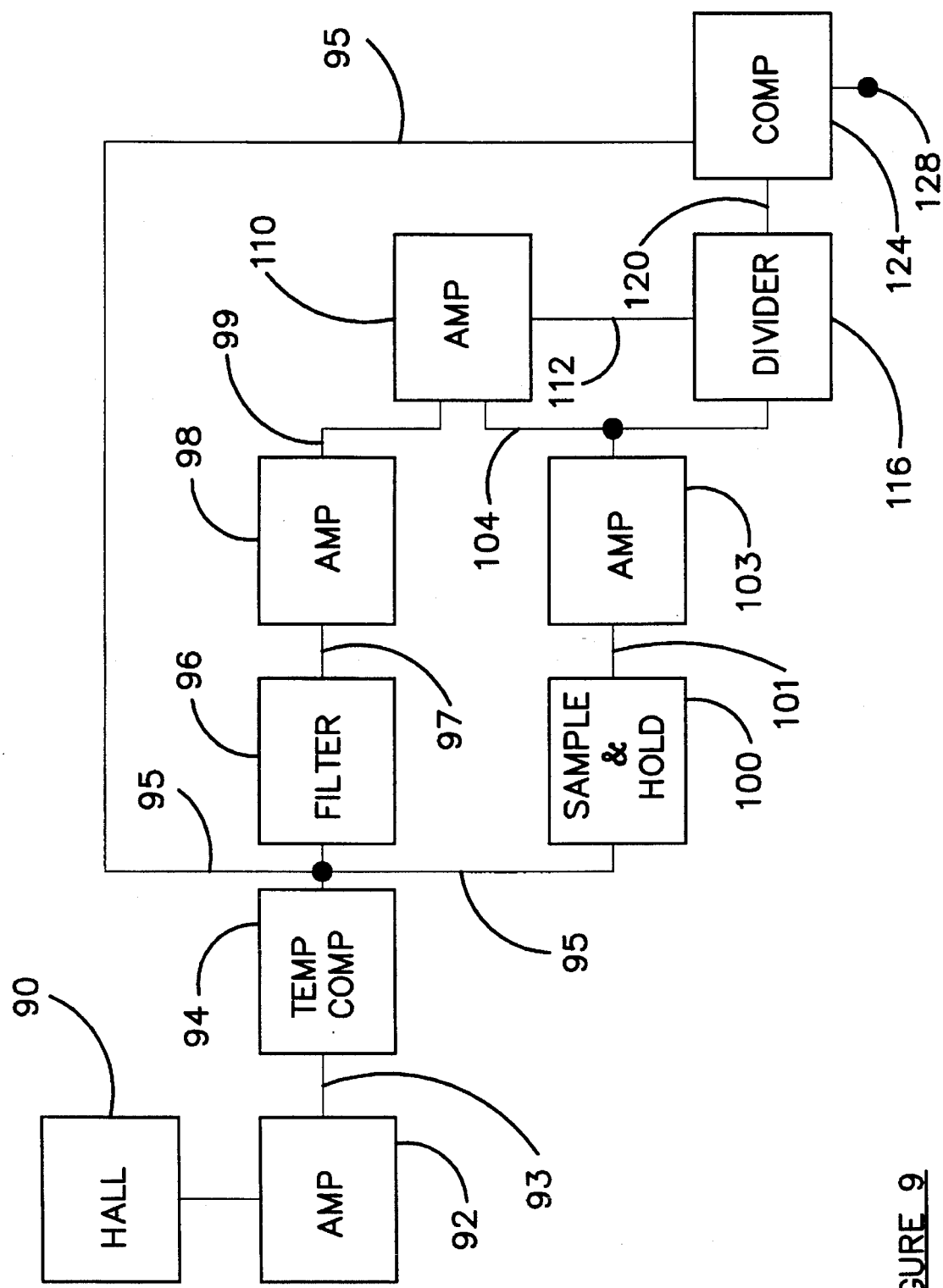
FIG. 9 is a functional block diagram of the circuit of the present invention.

FIG. 9 is a schematic representation of a circuit made in accordance with the present invention for use with a geartooth sensor. A magnetically sensitive component 90, such as a Hall effect element, is associated with a permanent magnet as described above. The Hall effect component 90 provides a signal that is representative of the strength of a magnetic field imposed perpendicularly to the sensing plane of the Hall effect element. The signal provided by the Hall effect element is amplified by an amplifier 92. This amplified signal 93 is connected to a temperature compensation circuit 94. Many different types of temperature compensation circuits are known to those skilled in the art and the circuit 94 will therefore not be described in detail. The first output signal 95 represents the magnetic field strength imposed on the Hall effect element 90. In the terminology used to describe the present invention, the first providing means comprises the Hall effect element 90 and its associated circuitry used in a circuit to provide the signal on line 95. The signal on line 95 represents the position of a ferromagnetic object within the detection zone of the geartooth sensor. A filter 96 is used to determine an average value of the signal on line 95. It provides a signal on line 97 to an amplifier 98. The amplifier has an output which provides a second output signal, on line 99, which is a function of the average value of the signal on line 95 over a predetermined period of time.

With continued reference to FIG. 9, a sample and hold circuit 100 is used to determine a minimum value of the first output signal on line 95. This minimum value is provided, on line 101, to amplifier 103. The amplifier 103 provides to amplifier 110 and divider 1, on line 104, a third output signal which is representative of the minimum value of the first output signal on line 95. Amplifier 110 compares the second output signal on line 99 with the third output signal on line 104 and provides a fourth output signal on line 112 which is representative of the difference between the second and third output signals. In a particularly preferred embodiment of the present invention, the amplifier 110 doubles the difference between its inputs and provides a signal on line 112 which is representative of twice the magnitude of the difference between the average value and the minimum magnitude of the first output signal on line 95. However, it should be understood that this doubling feature of amplifier 110 is not a requirement of the present invention in all of its embodiments. A divider 116 is used to enable the circuit in FIG. 9 to select a fractional portion of the signal on line 112 rather than requiring the circuit to use the entire magnitude of the fourth output signal on line 112. The divider 116 can comprise a plurality of resistors arranged as a resistor divider. A signal on line 120, which is a preselected portion of the fourth signal on line 112, is provided to a comparator 124. The comparator 124 compares the first signal on line 95 to the signal on line 120. The comparator 124 then provides a fifth signal, at circuit point 128 which represents the difference between the first output signal on line 95 and a threshold value that was provided to the comparator 124 on line 120.

With continued reference to FIG. 9, it can be seen that a first output signal on line 95 is provided by the Hall effect element 90 and its associated circuitry, such as the amplifier 92 and the temperature compensation circuit 94. The filter 96, in combination with amplifier 98, provide a second output signal on line 99 that is generally equivalent to the average value of the first output signal 95 taken over a preselected period of time which is determined by the components of the filter 96. The sample and hold circuit 100 determines a minimum value of the first output signal 95 over a preselected period of time which is determined by an R-C network of the sample and hold circuit 100. This minimum value of the first output value 95 is amplified by amplifier 103 which provides a third output signal on line 104. The second output signal on line 99 is compared to the third output signal on line 104 and the difference is amplified by amplifier 110 and doubled by the amplifier 110 in a preferred embodiment of the present invention. A fourth output signal is provided by the amplifier 110 and this fourth output signal can be further modified by the divider 116 which determines a fractional portion of the magnitude of the signal on 112 and provides that modified fractional signal on line 120 to the comparator 124. The comparator 124 compares this modified fourth signal on line 120 to the first output signal 95 and provides an amplified output signal at circuit point 128 which is representative of the difference between the first output signal on line 95 and the threshold signal which was determined by subtracting the minimum value determined by the sample and hold circuit 100 from the average value that was provided by the amplifier 98 and filter 96.

Figure 10:
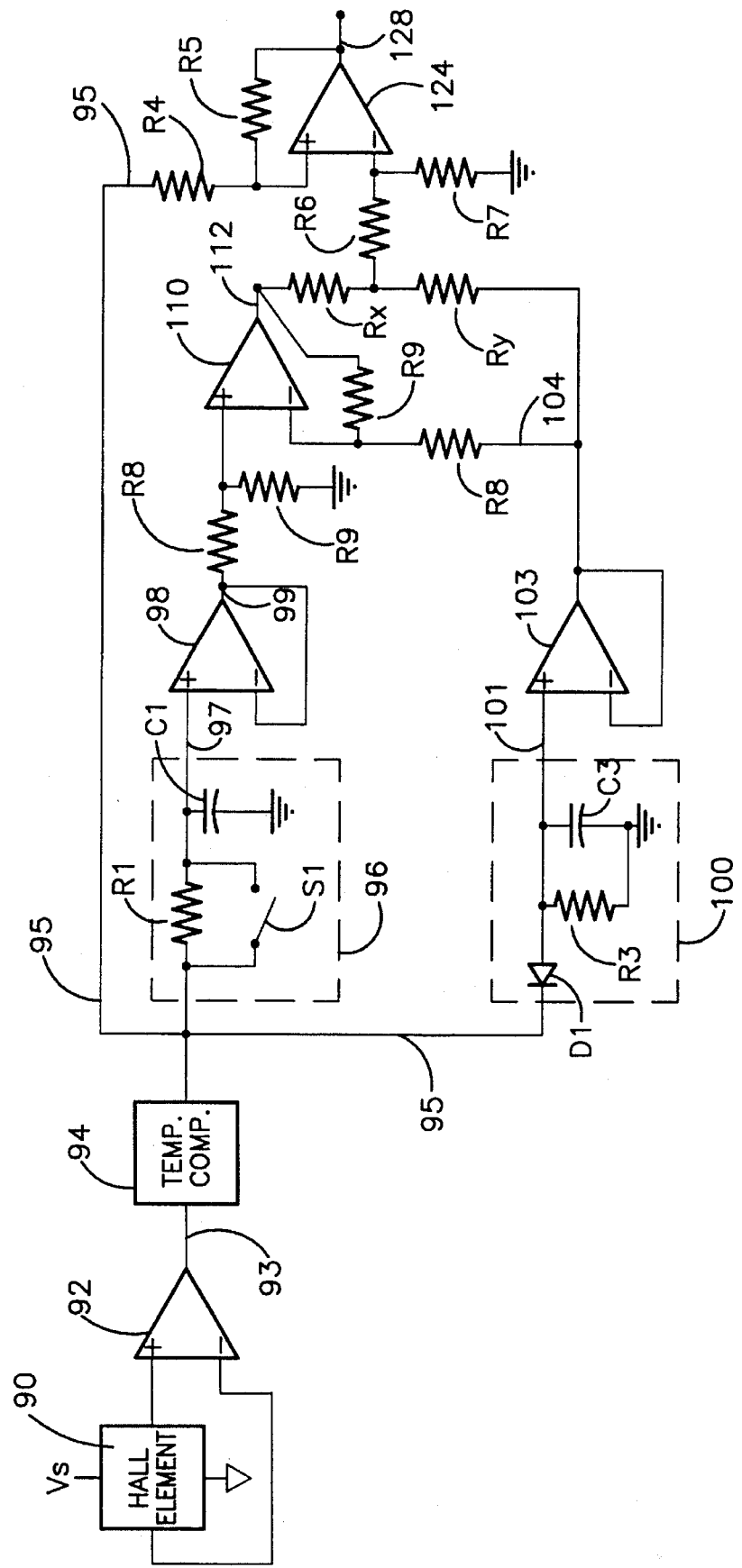
FIG. 10 is a more specific circuit of the present invention.

FIG. 10 is a schematic circuit diagram showing the components used to implement the functions described above in conjunction with FIG. 9. The Hall component 90 is connected in a manner generally known to those skilled in the art. Amplifier 92 provides a signal on line 93 to a temperature compensation circuit 94. The temperature compensation circuit 94 provides a first output signal on line 95. This first output signal, as can be seen in FIG. 10, is provided to the average value determining filter 96, the minimum value determining value sample and hold circuit 100 and the final comparison portion of the circuit shown in FIG. 10. The filter 96 comprises a resistor R1 and a capacitor C1. The switch S1 of the filter 96 is provided in some embodiments of the present invention to facilitate the startup procedure. The switch S1 is momentarily closed at power on and then held in a closed position for a preselected period of time. This permits the circuit to provide appropriate signals on line 97 more quickly than would otherwise be permitted by the time constant resulting from the R-C network of the filter 96. During normal operation, after the startup procedure is completed, the signal on line 97 represents the average value of the first output signal on line 95. This average value on line 97 is amplified by amplifier 98. The amplifier 98 therefore provides a signal on line 99 which is equivalent to the average value 97 of the first output signal on line 95.

With continued reference to FIG. 10, the first output signal 95 is also provided to the sample and hold circuit 100 which comprises diode D1, resistor R3 and capacitor C3. The sample and hold circuit 100 provides a signal on line 101 which is equivalent to the minimum magnitude of the first output signal 95 taken over a preselected period of time which is determined by the values of resistor R3 and capacitor C3. In a particularly preferred embodiment of the present invention, the time constant of the sample and hold circuit 100 is selected to be generally identical to the time constant of the filter 96. However, this equality of the two time constants is not an absolute requirement in all embodiments of the present invention. The signal on line 101 is amplified by the amplifier 103 to provide a signal on line 104 which is representative of the minimum value of the first output signal on line 95. Amplifier 110 provides an output signal on line 112 that is equivalent to double the difference between the average value on line 99 and the minimum value on line 104. Resistors Rx and Ry are provided as part of a divider circuit which enables the magnitude of the signal on line 112 to be reduced by a predetermined fraction and then provided to the comparator 124. The comparator 124 compares the first output signal on line 95 to the reduced fourth output signal which is connected to its inverting input. The comparator 124 provides an output signal at circuit point 128 which is representative of the difference between the first output signal 95 and the threshold magnitude determined as a function of the fourth output signal on line 112 as reduced by the selection of resistors Rx and Ry.

Although many alternative circuits can be used to perform the functions of the present invention, the component values shown in Table I represent exemplary component values.

TABLE I

| Reference | Value |
| --- | --- |
| C1 | 0.5 microfarad |
| C3 | 0.5 microfarad |
| R1 | 10 megohm |
| R3 | 10 megohm |
| R4 | 10 K-ohm |
| R5 | 2 megohm |
| R6 | 10 K-ohm |
| R7 | 2 megohm |
| R8 | 10 K-ohm |
| R9 | 20 K-ohm |

In the terminology used to describe a particularly preferred embodiment of the present invention, the first providing means comprises the Hall element 90 and its related components which combine to provide the first output signal on line 95. The second providing means comprises the filter 96 and the amplifier 98. The third providing means comprises the sample and hold circuit 110 in combination with the amplifier 103. The fourth providing means comprises the amplifier 110 and, in certain embodiments of the present invention, the divider 116 which comprises resistors Rx and Ry. The fifth providing means comprises the comparator 124. The first output signal is the signal on line 95, the second output signal is the signal on line 99, the third output signal is the signal on line 104, the fourth output signal is the signal on line 112 and the fifth output signal is the signal on line 128. Throughout the description of the preferred embodiment, the signals have been identified by the reference numerals of the lines on which they are transmitted.

Figure 11A:
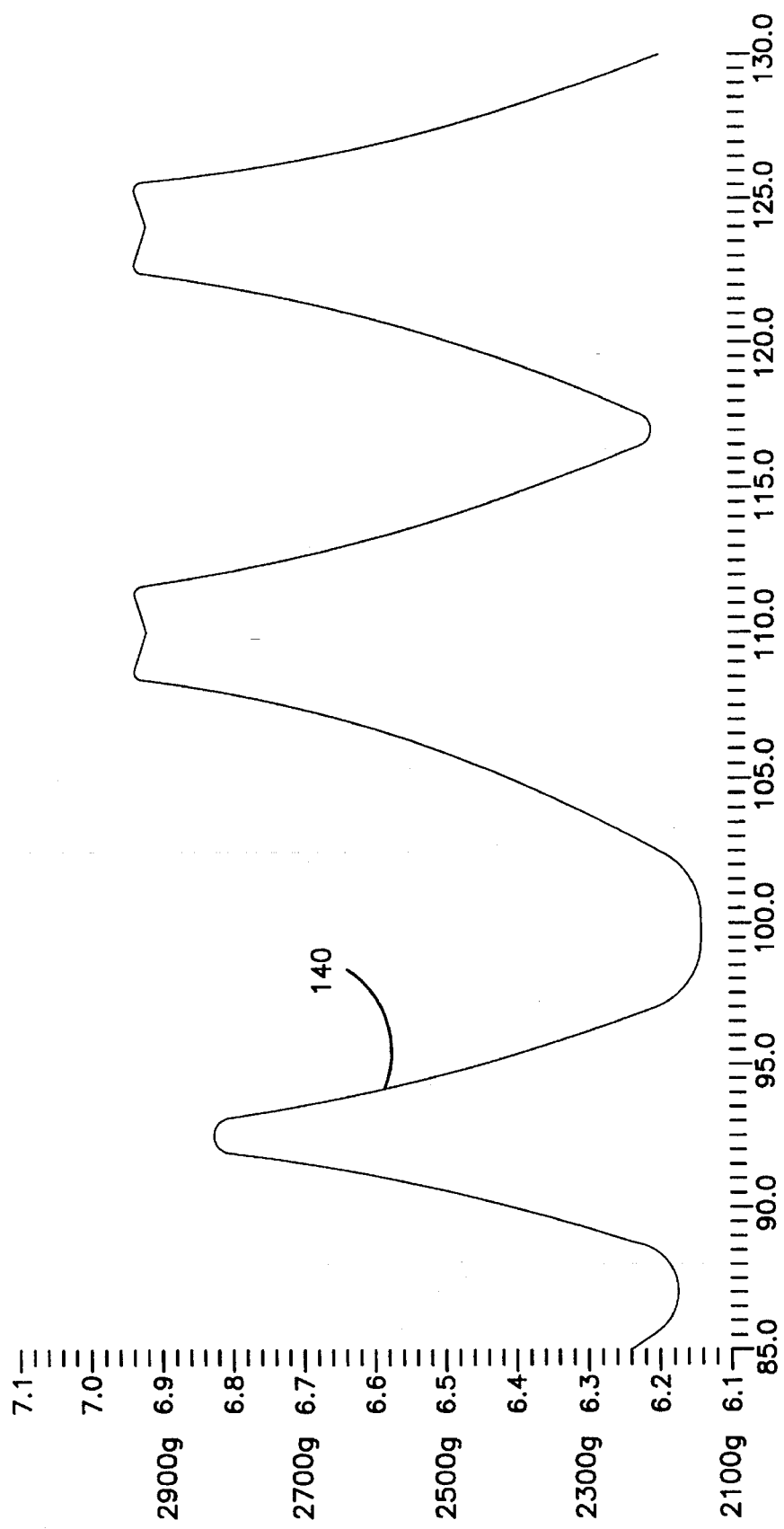
FIGS. 11A and 11B show empirical data for the purpose of illustrating a problem encountered by known geartooth sensors.
Figure 11B:
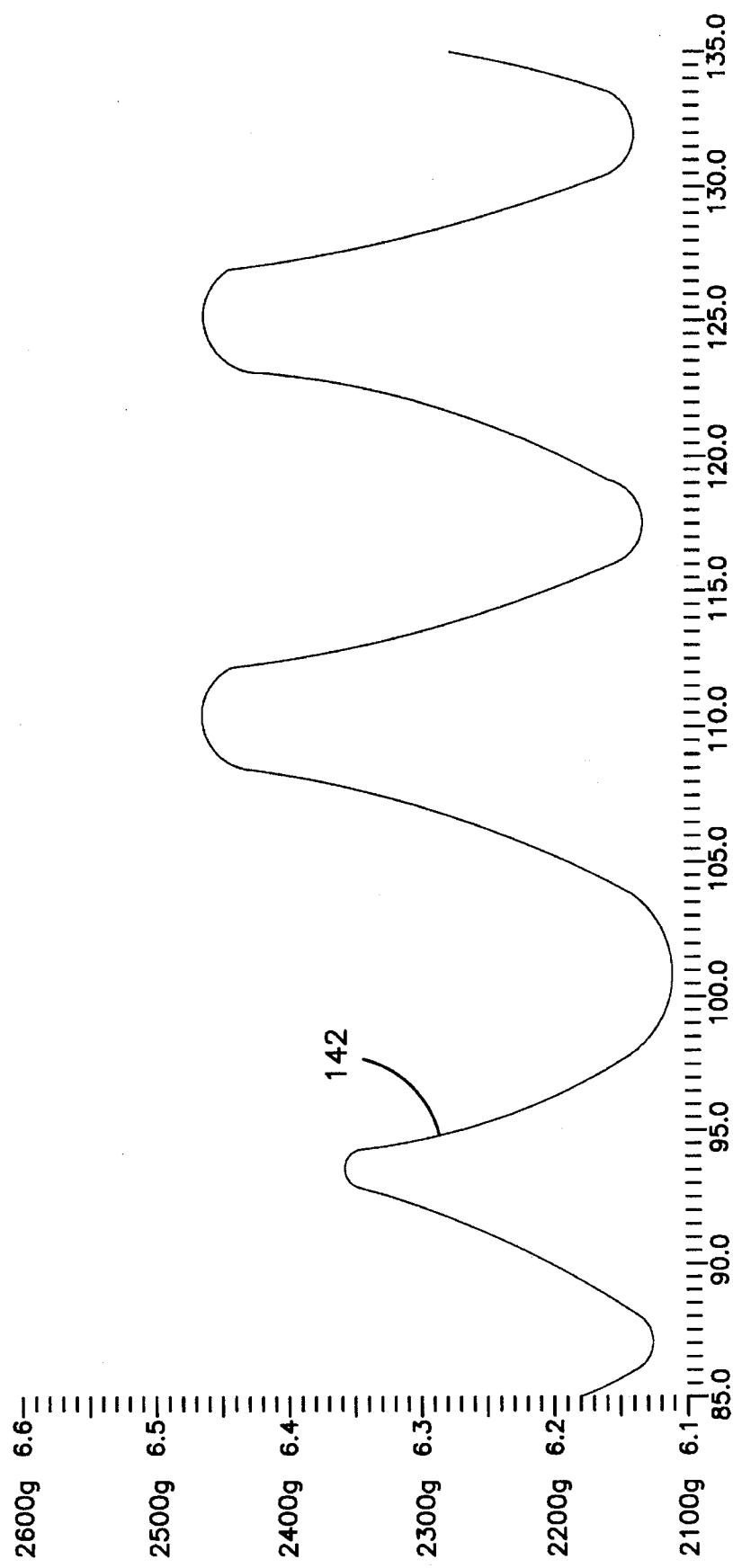

In the Description of the Preferred Embodiment of the present invention, the effect of the change in the gap between the magnetically sensitive component and the gearteeth has been described. FIGS. 11A and 11b illustrate an empirically determined example of this change. Signal 140 in FIG. 11A was provided by an exemplary geartooth sensor with its magnetically sensitive component disposed at a gap of 0.020 inches from a plurality of gearteeth passing through its detection zone. FIG. 11B illustrates a signal 142 provided by the same geartooth sensor with its magnetically sensitive component disposed at a gap of 0.050 inches from a plurality of gearteeth passing through its detection zone. The change in the magnitude of the output signal from the magnetically sensitive component, which is the first output signal in the terminology used above to describe the present invention, can be seen. In FIG. 11A, the wider teeth provide signals with a maximum value representing approximately 2900 gauss and the smaller tooth provides an output signal 140 with a maximum value of approximately 2750 gauss. However, when the gap is increased from 0.020 inches to 0.050 inches, the maximum value of signal 142 for the wide teeth decreases to approximately 2450 gauss and the maximum signal 142 for the smaller tooth decreases to approximately 2350 gauss. As can be seen, the selection of a threshold magnitude for the purpose of determining the presence and relative size of the gearteeth in this example is critical.

In effect, the present invention provides a threshold value that is selected in a manner which is less susceptible to these problems than geartooth sensors known to those skilled in the art. The threshold determined by the present invention is a function of the minimum value of the signal provided by the Hall effect element. It is also a function of the average value of the first output signal. In effect, the magnitudes of the minimum value and average value are manipulated to enable the geartooth sensor to be configured to select a threshold that is advantageous for a particular application and changeable when other applications are required. By selectively changing the divider circuit, identified as reference numeral 116 in FIGS. 9 and 10, the threshold magnitude can be appropriately determined as a variable offset from the minimum value wherein the variable offset is determined as a function of the changing shape of the first output signal. It has been found that in many applications, the ability to select a threshold signal in this manner provides significant benefit. It removes the susceptibility of a geartooth sensor to the various problems described above in conjunction with the prior art solutions known to those skilled in the art.

Although the present invention has been described with considerable detail and illustrated with significant specificity, alternative embodiments are within its scope.

The embodiments of the invention in which an exclusive property or right is claimed are defined as follows:

1. A magnetic sensor, comprising:
   a permanent magnet;
   a magnetically sensitive component disposed proximate said magnet;
   first means, connected to said magnetically sensitive component, for providing a first output signal which is representative of the presence of a ferromagnetic member within a detection zone of said sensor;
   second means, connected to said first providing means, for providing a second output signal which is representative of an average value of said first output signal over a first preselected period of time;

third means, connected to said first providing means, for providing a third output signal which is representative of a minimum value of said first output signal over a second period of time;

fourth means, connected to said second and third providing means, for providing a fourth output signal which is a function of the difference between said second and third output signals; and fifth means, connected to said first and fourth providing means, for providing a fifth output signal which is representative of the difference between said first and fourth output signals.

2. The sensor of claim 1, wherein:

said first and second periods of time are generally equal to each other.

3. The sensor of claim 1, wherein:

said fourth providing means comprises means for doubling the difference between said second and third output signals.

4. The sensor of claim 1, wherein:

said fourth output signal is generally equal to two times the difference between the average value of said first output signal said third output signal.

5. The sensor of claim 1, wherein:

said sensor is a geartooth sensor.

6. The sensor of claim 5, further comprising:

a gear having a plurality of teeth, said gear being rotatable about an axis of rotation, said plurality of teeth being movable through a detection zone of said geartooth sensor.

7. The sensor of claim 1, wherein:

the mathematical relationship of the fifth output signal to the first and fourth output signals is variable.

8. A magnetic sensor, comprising:

a permanent magnet;

a magnetically sensitive component disposed proximate said magnet;

first means, connected to said magnetically sensitive component, for providing a first output signal which is representative of the presence of a ferromagnetic member within a detection zone of said sensor;

second means, connected to said first providing means, for providing a second output signal which is representative of an average value of said first output signal over a first preselected period of time;

third means, connected to said first providing means, for providing a third output signal which is representative of a minimum value of said first output signal over a second period of time;

fourth means, connected to said second and third providing means, for providing a fourth output signal which is a function of the difference between said second and third output signals; and fifth means, connected to said first and fourth providing means, for providing a fifth output signal which is representative of the difference between said first and fourth output signals, said second providing means comprising means for amplifying said average value of said second output signal.

9. The sensor of claim 8, wherein:

said first and second periods of time are generally equal to each other.

10. The sensor of claim 8, wherein:

said fourth output signal is generally equal to two times the difference between the average value of said first output signal said third output signal.

11. The sensor of claim 8, wherein:

said sensor is a geartooth sensor.

12. The sensor of claim 11, further comprising:

a gear having a plurality of teeth, said gear being rotatable about an axis of rotation, said plurality of teeth being movable through a detection zone of said geartooth sensor.

13. The sensor of claim 8, wherein:

the mathematical relationship of the fifth output signal to the first and fourth output signals is variable.

14. A magnetic sensor, comprising:

a permanent magnet;

a magnetically sensitive component disposed proximate said magnet;

first means, connected to said magnetically sensitive component, for providing a first output signal which is representative of the presence of a ferromagnetic member within a detection zone of said sensor;

second means, connected to said first providing means, for providing a second output signal which is representative of an average value of said first output signal over a first preselected period of time;

third means, connected to said first providing means, for providing a third output signal which is representative of a minimum value of said first output signal over a second period of time;

fourth means, connected to said second and third providing means, for providing a fourth output signal which is a function of the difference between said second and third output signals; and fifth means, connected to said first and fourth providing means, for providing a fifth output signal which is representative of the difference between said first and fourth output signals, said fourth output signal being generally equal to two times the difference between the average value of said first output signal and said third output signal.

15. The sensor of claim 14, wherein:

said first and second periods of time are generally equal to each other.

16. The sensor of claim 14, wherein:

said sensor is a geartooth sensor.

17. The sensor of claim 16, further comprising:

a gear having a plurality of teeth, said gear being rotatable about an axis of rotation, said plurality of teeth being movable through a detection zone of said geartooth sensor.

18. The sensor of claim 14, wherein:

the mathematical relationship of the fifth output signal to the first and fourth output signals is variable.

* * * * *